(12) United States Patent
Ju et al.

(10) Patent No.: US 11,818,240 B2
(45) Date of Patent: Nov. 14, 2023

(54) PAM-4 BAUD-RATE CLOCK AND DATA RECOVERY CIRCUIT USING STOCHASTIC PHASE DETECTION TECHNIQUE

(71) Applicants: Korea Electronics Technology Institute, Seongnam-si (KR); Seoul National University R&DB Foundation, Seoul (KR)

(72) Inventors: Ha Ram Ju, Seoul (KR); Sung Ho Lee, Seoul (KR); Deog Kyoon Jeong, Seoul (KR)

(73) Assignees: Korea Electronics Technology Institute, Seongnam-si (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 17/547,378

(22) Filed: Dec. 10, 2021

(65) Prior Publication Data

US 2022/0190999 A1    Jun. 16, 2022

(30) Foreign Application Priority Data

Dec. 11, 2020   (KR) ........................ 10-2020-0173015

(51) Int. Cl.
*H04L 7/02* (2006.01)
*H04L 7/00* (2006.01)
*H03L 7/091* (2006.01)

(52) U.S. Cl.
CPC ............ *H04L 7/0016* (2013.01); *H03L 7/091* (2013.01); *H04L 7/0054* (2013.01); *H04L 7/0079* (2013.01)

(58) Field of Classification Search
CPC ... H04L 7/0016; H04L 7/0054; H04L 7/0025; H04L 7/0062; H04L 7/0079; H04L 7/033;
(Continued)

(56) References Cited

U.S. PATENT DOCUMENTS 9,313,017 B1 * 4/2016 Liao ...................... H04L 7/0062
9,455,848 B1 * 9/2016 Zhang ................... H04L 7/0062
(Continued)

FOREIGN PATENT DOCUMENTS

KR    10-2020-0060612 A    6/2020

OTHER PUBLICATIONS

Korean Office Action dated Jan. 25, 2022, in counterpart Korean Patent Application No. 10-2020-0173015 (4 pages in English and 5 pages in Korean).

(Continued)

*Primary Examiner* — Betsy Deppe
(74) *Attorney, Agent, or Firm* — NSIP Law

(57) ABSTRACT

There is provided a clock and data recovery circuit for a high-speed PAM-4 receiver through statistical learning. A clock and data recovery device according to an embodiment includes: an input unit through which data is inputted; a clock input unit through which a clock is inputted; a sampling unit configured to sample the inputted data by using the inputted clock; a controller configured to combine results of sampling at a plurality of sampling points, to determine a state of the clock based on the combined results, and to generate a control value for controlling the clock; and an adjustment unit configured to adjust the clock applied to the sampling unit, based on the control value generated by the controller. Accordingly, a hardware structure is simplified and energy efficiency is enhanced compared to an exiting oversampling clock and data recovery circuit for a PAM-4 receiver.

19 Claims, 19 Drawing Sheets

(58) Field of Classification Search
CPC ... H04L 7/0331; H04L 7/0334; H04L 7/0337; H04L 25/04917; H04L 25/4917; H03L 7/0807; H03L 7/0814; H03L 7/091
See application file for complete search history.

(56) References Cited

U.S. PATENT DOCUMENTS 9,906,231 B2* 2/2018 Kang ................ H03L 7/091
10,374,785 B2* 8/2019 Ho .................... H04L 7/033

OTHER PUBLICATIONS

Ju, Haram et al. "A 48Gb/s 2.4pJ/B PAM-4 Baud-Rate Digital CDR with Stochastic Phase Detection Technique in 40nm CMOS" *IEEE Asian Solid-State Circuits Conference,* Busan, Korea, Nov. 9, 2021 (5 pages in English).

* cited by examiner

| | CICC 20 | RFIC 21 | VLSI 19 | ISSCC 20 | This work |
|---|---|---|---|---|---|
| Technology Node | 28nm CMOS | 28nm CMOS | 7nm FinFET | 10nm FinFET | 40nm CMOS |
| Modulation | PAM4 | PAM-4 | PAM-4 | PAM4 | PAM-4 |
| PD type | Oversampling | Oversampling | Baud-rate (MM PD) | Baud-rate (MM PD) | Baud-rate (Stochastic PD) |
| Data Rate [Gb/s] | 23.4 - 29.1 | 47.6 - 58.8 | 56 | 56 | 48 |
| Clocking | Full-rate | Half-rate | 32-Way | 32-Way | Half-rate |
| Number of Samplers | 12 | 8 | 32 × 8b ADC | 32 × 7b ADC | 10 |
| Equalizer | N/A | N/A | CTLE 20-tap FFE 1-tap DFE | CTLE 9-tap FFE 1-tap DFE | CTLE 1 tap DFE |
| Area [mm$^2$] | 0.0285 | 0.057 | 0.37 | 0.72 / Lane | 0.24 |
| Power [mW] | 19.16 | 11 - 13.1 | 500 | 431.2 | 116.3 |
| Energy Efficiency [pJ/b] | 0.68 | 0.22 - 0.25 | 8.92 | 7.7 | 2.42 |
| BER | <10$^{-12}$ | <10$^{-12}$ | <10$^{-7}$ | <10$^{-10}$ | <10$^{-11}$ |

FIG. 19

PAM-4 BAUD-RATE CLOCK AND DATA RECOVERY CIRCUIT USING STOCHASTIC PHASE DETECTION TECHNIQUE

CROSS-REFERENCE TO RELATED APPLICATION(S) AND CLAIM OF PRIORITY

This application is based on and claims priority under 35 U.S.C. § 119 to Korean Patent Application No. 10-2020-0173015, filed on Dec. 11, 2020, in the Korean Intellectual Property Office, the disclosure of which is herein incorporated by reference in its entirety.

BACKGROUND

Field

The present disclosure relates to a clock and data recovery (CDR) circuit of high-speed PAM-4 receiver integrated circuits (IC), which is implemented by statistical learning which uses big data rather than an existing logic-based approach, and an optimizing method thereof.

Description of Related Art

With the recent advent of data centers or Internet of Things (IoT), a data communication capacity of chip-to-chip wired communication swiftly increases and a multi-level data format such as pulse amplitude modulation (PAM)-4 level, rather than a binary data format of an existing non-return-to-zero (NRZ) type, is rising as a probable candidate of a next-generation input/output (I/O) interface.

In particular, PAM-4 is being employed as a standard data format in various wired communication industrial standards, such as optical internetworking forum-common electrical I/O (OIF-CEI), Ethernet, Infiniband, peripheral component interconnect express (PCIe).

In implementing such a PAM-4 I/O interface, a circuit design at a receiver end is very important. In particular, a clock and data recovery circuit for a PAM-4 receiver, which is the most important block, is mostly divided into two types, that is, an oversampling-based clock and data recovery circuit which samples at a higher speed than a transmission rate of data inputted to a receiver, and a Baud-rate sampling-based clock and data recovery circuit which samples at the same speed as a data transmission rate.

However, the former circuit requires so many high-speed samplers to be implemented, so that it has a serious disadvantage in operating with low power. On the other hand, the latter circuit, the Baud-rate sampling-based clock and data recovery circuit, may reduce the number of samplers and the speed of a sampling clock, so that clocking power can be relatively reduced and it is more advantageous to implement a high speed/low power PAM-4 receiver.

However, Mueller-Muller CDR (MMCDR), which is most popular among the Baud-rate sampling-based clock and data recovery circuits, still has a disadvantage that power consumption is high due to the use of high-speed and high-resolution ADCs and bulky digital back-ends including decision feedback equalizers (DFEs), and feed-forward equalizer (FFEs), etc.

Sign-sign MMCDR (SS-MMCDR) which is simplified to solve these problems does not have the optimal phase locking characteristic. This is because the SS-MMCDR also has a serious disadvantage that it does not well operate in an environment where attenuation of signal integrity and distortion are great due to a channel loss. In particular, since the channel loss increases as the speed of wired communication increases, the above-mentioned problems of the existing structures become more serious when a high-seed PAM-4 receiver is designed.

Accordingly, it may be essential to suggest a Baud-rate sampling-based clock and data recovery circuit of a new form, which is capable of operating at high speed while operating with low power, in implementing next-generation I/O interface integrated circuits (ICs).

SUMMARY

The present disclosure has been developed to address the above-discussed deficiencies of the prior art, and an object of the present disclosure is to provide a clock and data recovery circuit which is optimized according to statistical learning using big data, as a solution to solve the problems of the oversampling-based clock and data recovery circuit used for an existing PAM-4 receiver, or the Baud-rate sampling-based clock and data recovery circuit, which is representative of the Mueller-Muller clock and data recovery circuit.

According to an embodiment of the present disclosure to achieve the above-described object, a clock and data recovery device includes: an input unit through which data is inputted; a clock input unit through which a clock is inputted; a sampling unit configured to sample the inputted data by using the inputted clock; a controller configured to combine results of sampling at a plurality of sampling points, to determine a state of the clock based on the combined results, and to generate a control value for controlling the clock; and an adjustment unit configured to adjust the clock applied to the sampling unit, based on the control value generated by the controller.

The controller may combine a first sampling result at a first sampling point and a second sampling result at a second sampling point.

The first sampling point and the second sampling point may be consecutive sampling points which are adjacent to each other.

The controller may list and combine the sampling results, and the number of combined results may be (Number of sampling results)^(Number of sampling points).

The controller may generate a control value indicated by the combined results. The controller may generate a control value for shifting the clock forward or backward.

The controller may generate a control value for shifting the clock forward or backward, based on a first probability which is a probability that a sampling point matching a combined result is ahead of an ideal point, and a second probability which is a probability that the sampling point is behind the ideal point.

The controller may generate a control value whereby an amount for shifting the clock backward is larger as the first probability is higher than the second probability. The controller may generate a control value whereby an amount for shifting the clock forward is larger as the second probability is higher than the first probability.

The first probability and the second probability matching the combined results may be set by statistical values of results of really measuring by using a plurality of data and a plurality of clocks.

The adjustment unit may adjust a phase of the clock applied to the sampling unit, based on the control value.

According to another embodiment of the present disclosure, a clock and data recovery method includes the steps of: inputting data; inputting a clock; sampling the inputted data by using the inputted clock; combining results of sampling at a plurality of sampling points; determining a state of the clock based on the combined results, and generating a control value for controlling the clock; and adjusting the clock applied to the sampling unit, based on the generated control value.

According to still another embodiment of the present disclosure, a clock and data recovery device includes: a sampling unit configured to sample data by using a clock; a controller configured to combine results of sampling at a plurality of sampling points, to determine a state of the clock based on the combined results, and to generate a control value for controlling the clock; and an adjustment unit configured to adjust the clock applied to the sampling unit, based on the control value generated by the controller.

According to yet another embodiment of the present disclosure, a clock and data recovery method includes the steps of: sampling data by using a clock; combining results of sampling at a plurality of sampling points; determining a state of the clock based on the combined results, and generating a control value for controlling the clock; and adjusting the clock applied to the sampling unit, based on the generated control value.

According to further embodiment of the present disclosure to achieve the above-described object, a system includes a receiver to receive data and a clock and data recovery device, wherein the clock and data recovery device includes: an input unit through which data is inputted; a clock input unit through which a clock is inputted; a sampling unit configured to sample the inputted data by using the inputted clock; a controller configured to combine results of sampling at a plurality of sampling points, to determine a state of the clock based on the combined results, and to generate a control value for controlling the clock; and an adjustment unit configured to adjust the clock applied to the sampling unit, based on the control value generated by the controller.

According to embodiments of the present disclosure as described above, by utilizing the advantages of a Baud-rate sampling-based clock and data recovery circuit, a hardware structure can be simplified and energy efficiency can be enhanced, compared to an existing oversampling-based clock and data recovery circuit for a PAM-4 receiver.

In addition, according to embodiments of the present disclosure, unlike the existing Baud-rate sampling-based clock and data recovery circuit for the PAM-4 receiver which has problems under a high-speed wired communication environment where signal attenuation is strong, the clock and data recovery circuit can operate well even when signal attenuation is great.

In addition, according to embodiments of the present disclosure, the clock and data recovery circuit for the PAM-4 receiver can be optimized in a relatively simple method by using a statistical learning technique using big data, and the optimization method can be applied to optimize other IC systems.

BRIEF DESCRIPTION OF THE DRAWINGS

FIG. 19 is a view illustrating comparison of performance of a PAM-4 receiver chip according to an embodiment of the present disclosure, and other PAM-4 receiver chips.

DETAILED DESCRIPTION

Hereinafter, the present disclosure will be described in detail with reference to the accompanying drawings.

With the advent of the concept of Internet of things (IoT), cloud-based computing and networking services, storage facilities such as data centers are emerging, and accordingly, data communication capacity is rapidly increasing all over the world.

However, existing wired communication, which uses copper lines, may have limitations on satisfying a transmission speed of wired communication which is gradually increasing for various causes, such as signal attenuation, signal distortion, signal crosstalk, or the like.

To overcome the limitations, an attempt to use data formats like pulse amplitude modulation (PAM), quadrature amplitude modulation (QAM), quadrature phase shift keying (QPSK), which are higher level modulation, rather than a data format of non-return-to-zero (NRZ) which has been widely used in an existing high-speed data link, is increasing.

Figure 1:
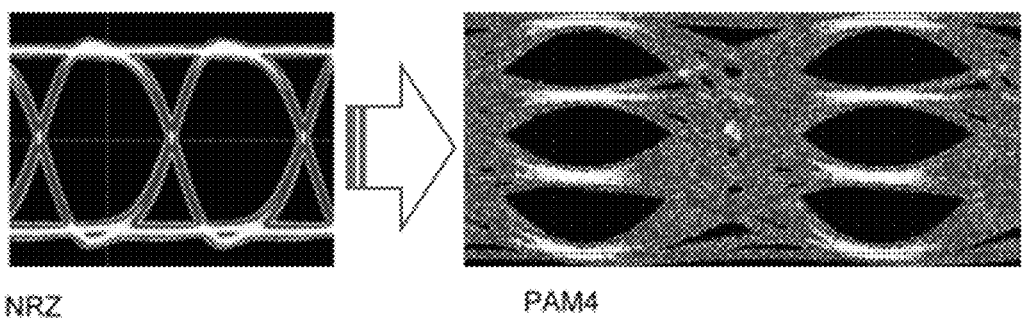
FIG. 1 is a view illustrating a change in a data waveform according to NRZ and PAM-4 data formats.

Among these, multi-level wired communication which is representative of PAM is arising as a key of a next-generation high-speed interface, and in particular, PAM-4 which is a four-level data format is being increasingly employed in various wired communication industrial standards such as OIF-CEI, PCIe, Ethernet. FIG. 1 shows a difference in waveforms between NRZ and PAM-4.

When the PAM-4 data format is used, the Nyquist frequency may be reduced by half compared to NRZ, and there is an advantage that an operation can be performed even if a bandwidth of a data driving circuit is reduced by half. Accordingly, researches on PAM-4 transmitters/receivers which operate at high speed are essential for implementation of a next generation high-speed data transmission IC for the future, and in particular, it may be crucial to implement a PAM-4 receiver IC to operate with high reliability while operating at high speed with low power. In designing a PAM-4 receiver for high-speed wired communication, it is most important to implement a clock and data recovery circuit.

Figure 2:
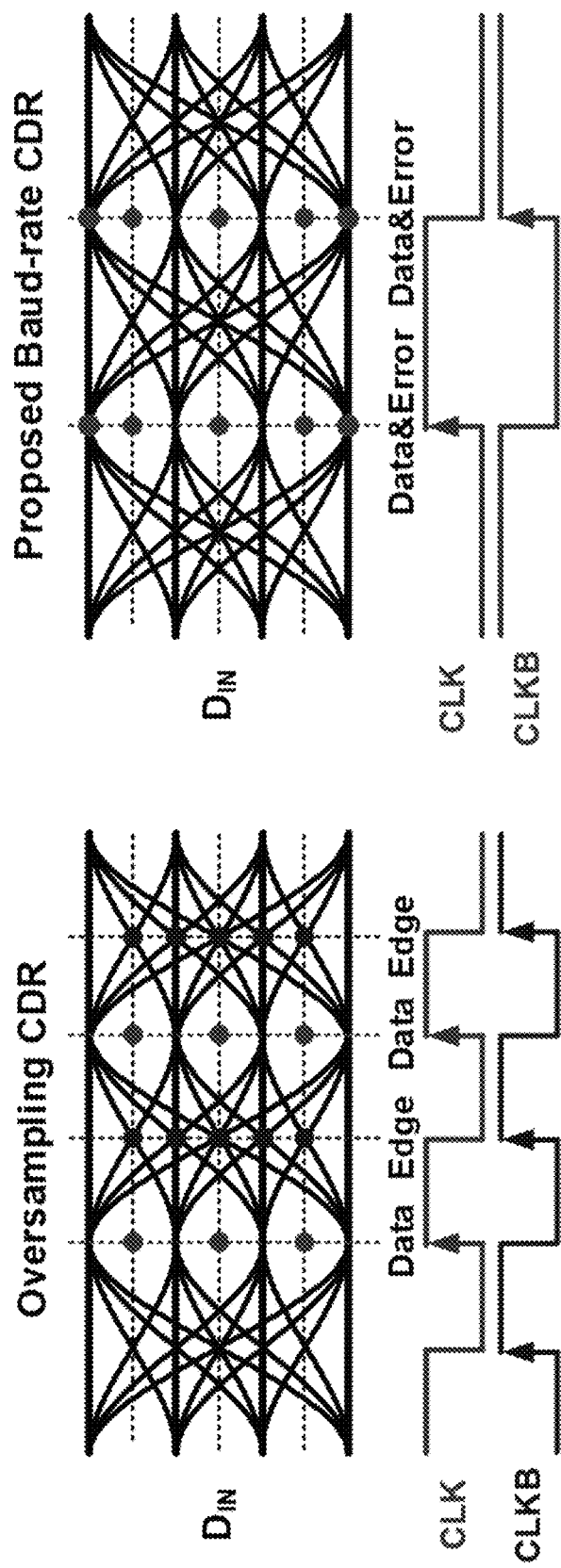
FIG. 2 is a view illustrating sampling points of an oversampling-based clock and data recovery circuit and a Baud-rate sampling-based clock and data recovery circuit.

A clock and data recovery circuit for a PAM-4 receiver may be mostly divided into an oversampling-based type that samples at higher speed than a transmission rate of data inputted to a receiver, and a Baud-rate sampling-based type that samples at the same speed. Timings and offsets of sampling points necessary in the two structures are illustrated in FIG. 2.

Since the oversampling-based clock and data recovery circuits for the existing PAM-4 receiver require a large number of high-speed samplers due to oversampling-based characteristics, there is a disadvantage that power consumption is very high. Accordingly, it is more advantageous to utilize the Baud-rate sampling-based clock and data recovery circuit, rather than the oversampling-based type, in order to operate at high speed with low-power.

However, the existing Baud-rate sampling-based clock and data recovery circuit for the PAM-4 receiver does not have advantages only. A Mueller-Muller clock and data recovery circuit, which is most popular among the Baud-rate sampling-based clock and data recovery circuits, has high power consumption due to the use of high speed and high resolution ADCs and bulky digital back-ends including decision-feedback equalizers (DFEs), and feed-forward equalizers (FFEs), etc.

In addition, sign-sign MMCDR (SS-MMCDR), which is made to solve the above-mentioned problem, also has a great high channel loss and has a problem that it does not well operate under an ultra-high speed wired communication environment where signal attenuation and distortion are great.

Accordingly, it may be essential to develop a Baud-rate sampling-based clock and data recovery circuit of a new structure in configuring a high-speed and low-power I/O interface.

Figure 3:
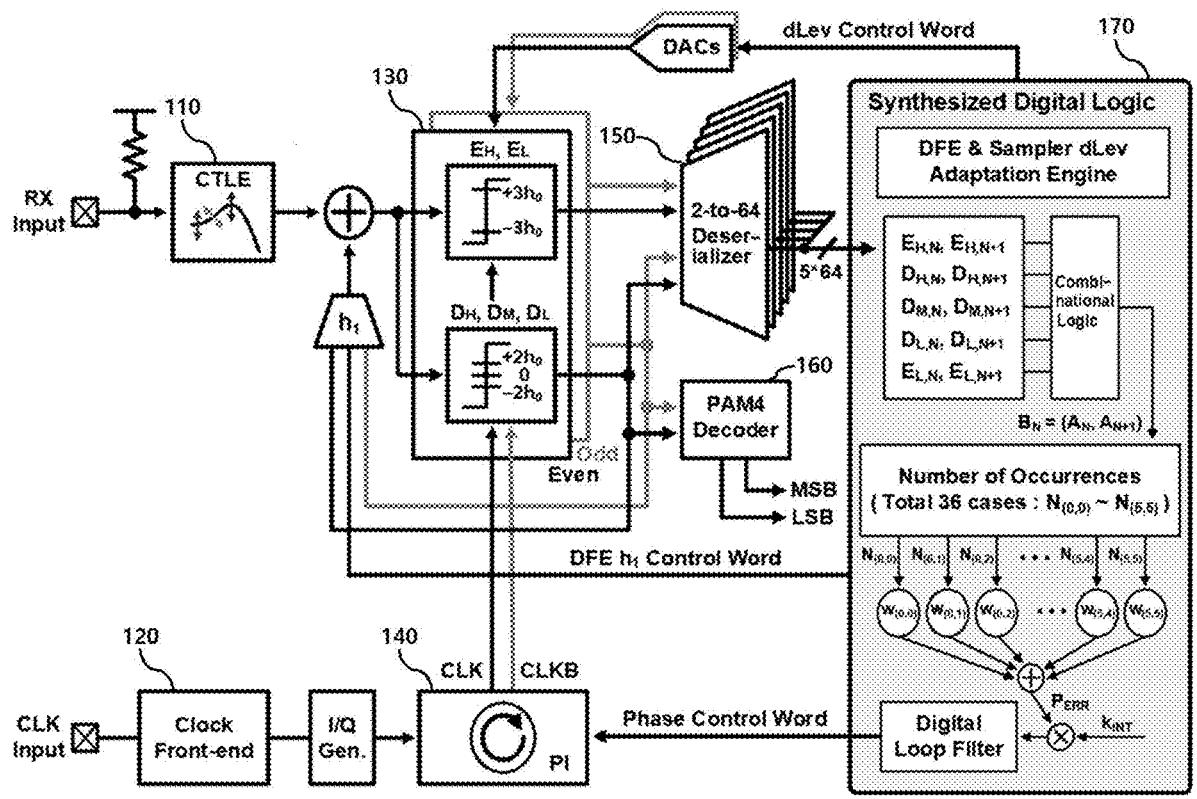
FIG. 3 is a view illustrating an overall structure of a clock and data recovery circuit for a high-speed PAM-4 receiver according to an embodiment of the disclosure.

A Baud-rate sampling-based clock and data recovery circuit for a PAM-4 receiver according to an embodiment of the present disclosure is shown in FIG. 3. The clock and data recovery device for the PAM-4 receiver according to an embodiment of the present disclosure may include a continuous-time linear equalizer (CTLE) 110, a clock front-end (CFE) 120, a sampling unit 130, a phase interpolator (PI) 140, a de-serializer 150, a decoder 160, and a synthesized digital logic (SDL) 170.

The CTLE 110 is an input end through which data is inputted, and compensates for signal attenuation of input data, and the CFE 120 is an input end through which a reference clock is inputted, and amplifies an inputted clock.

Figure 4:
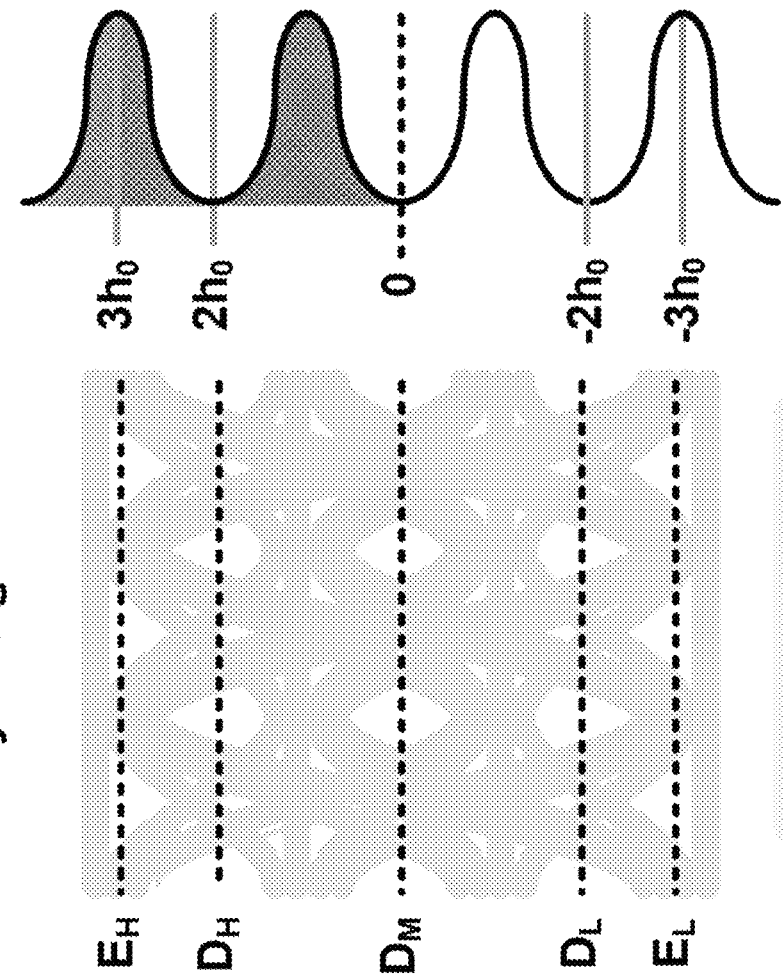
FIG. 4 is a view illustrating an example of data level adaption of a Baud-rate sampler.

The sampling unit 130 samples data inputted from the CTLE 110 by using a clock inputted to the CFE 120. The sampling unit 130 samples data by using three data samplers and two error samplers for each symbol. An adapted sampling threshold of the three data samplers and the two error samplers used is shown in FIG. 4.

In order to sample two adjacent symbols, the sampling unit 130 and the PI 140 and the de-serializer 150, which will be described below, may be divided into an even block and an odd block.

The PI 140 may adjust a phase of the clock applied to the sampling unit 130 from the CFE 120. The clock phase may be adjusted by the PI 140 under control of the SDL 170, which will be described below. That is, the PI 140 may adjust the phase of the reference clock applied by the CFE 120 based on a control value which is generated by the SDL 170, and may transmit the reference clock to the sampling unit 130.

The de-serializer 150 deserializes results of sampling at the sampling unit 130, and transmits the sampling results to the SDL 170. The decoder 160 restores data by decoding the sampling results of the sampling unit 130.

The SDL 170 is a control means for controlling configurations of the clock and data recovery device according to an embodiment of the present disclosure, and includes a sampler data level (dLev) & DFE adaptation engine and a stochastic phase detector.

In particular, the SDL 170 combines the results of sampling at a plurality of sampling points by the sampling unit 130, and determines a state of the clock based on the combined results, and may generate a control value for controlling the clock.

Specifically, the SDL 170 may list and combine sampling result #1 and sampling result #2 at sampling point #1 and sampling point #2 which are adjacent and consecutive sampling points.

The number of results combined by the SDL 170 is calculated according to the following equation:

(Number of sampling results)^(Number of sampling points)

If the number of sampling results is 6 and the number of sampling points is 2 as described above, the number of combined results is 36 (=6^2).

The SDL 170 generates a control value indicated by the combined results, and the control value is a control value for shifting the clock forward or backward. If there are 36 combined results as shown in the above-mentioned example, there are 36 control values. This is because control values match combined results, respectively.

The SDL 170 generates a control value for shifting the clock forward or backward, based on a 'probability that a sampling point matching a combined result is ahead of an ideal point' (hereinafter, referred to as a 'probability of being ahead'), and a 'probability that a sampling point is behind the ideal point' (hereinafter, referred to as a 'probability of being behind').

Specifically, the SDL 170 may generate a control value for shifting the clock backward if the probability of being ahead is higher than the probability of being behind, and may generate a control value for shifting the clock forward if the probability of being behind is higher than the probability of being ahead, and the SDL 170 may generate a control value for holding the clock as it is if the probability of being ahead is the same as the probability of being behind.

In addition, the SDL 170 may generate a control value whereby an amount for shifting the clock backward is larger as a degree by which the probability of being ahead is higher than the probability of being behind is greater. For example, when the 'probability of being ahead' is 0.8 and the 'probability of being behind' is 0.2, the amount for shifting the clock backward is larger than when the 'probability of being ahead' is 0.6 and the 'probability of being behind' is 0.4.

In addition, the SDL 170 may generate a control value whereby an amount for shifting the clock forward is larger as a degree by which the probability of being behind is higher than the probability of being ahead is greater. For example, when the 'probability of being behind' is 0.8 and the 'probability of being ahead' is 0.2, the amount for shifting the clock forward is larger than when the 'probability of being behind' is 0.6 and the 'probability of being ahead' is 0.4.

The probability of being ahead and the probability of being behind which match the combined results may be statistically set. That is, a relationship between the combined results and the probability of being ahead and the probability of being behind may be set by combining the sampling results measured at the plurality of sampling points by using the plurality of data, measuring the phase of the clock, that is, the degrees of being ahead/behind of the sampling points, and matching both degrees.

When the clock and data recovery device for the PAM-4 receiver according to an embodiment of the present disclosure is implemented, the SDL 170 may be set to contain a table reflecting the above-described contents. In the table, control values are mapped onto the combined results one by one.

A method for controlling a clock by the SDL 170 will be described in detail below with reference to FIGS. 5 to 8.

As shown in FIG. 4, if a main cursor on a single-bit response (SBR) is $h_0$, the adaptation engine operates by using a sign-sign least-mean-square (SS-LMS) algorithm, such that dLevs of the three data samplers $D_H$, $D_M$, $D_L$ used in the clock and recovery circuit according to an embodiment of the present disclosure are $2h_0$, $0$, $-2h_0$, respectively, and dLevs of the two error samplers $E_H$, $E_L$ are $3h_0$, $-3h_0$. As shown in FIG. 4, an un-even ratio of UP and DN update coefficients may be determined on the assumption of Gaussian distribution of the PAM-4 signal.

A statistical learning technique for optimizing the clock and data recovery circuit for the PAM-4 receiver according to an embodiment of the present disclosure is expressed in FIGS. 5 to 8. As shown in FIG. 3, the sampling unit 130 of the clock and data recovery circuit according to an embodiment of the present disclosure may be divided into an even block and an odd block to sample input data, and each block may have 5 samplers in total including two error samplers and three data samplers, and accordingly, the total number of necessary samplers is 10.

Figure 5:
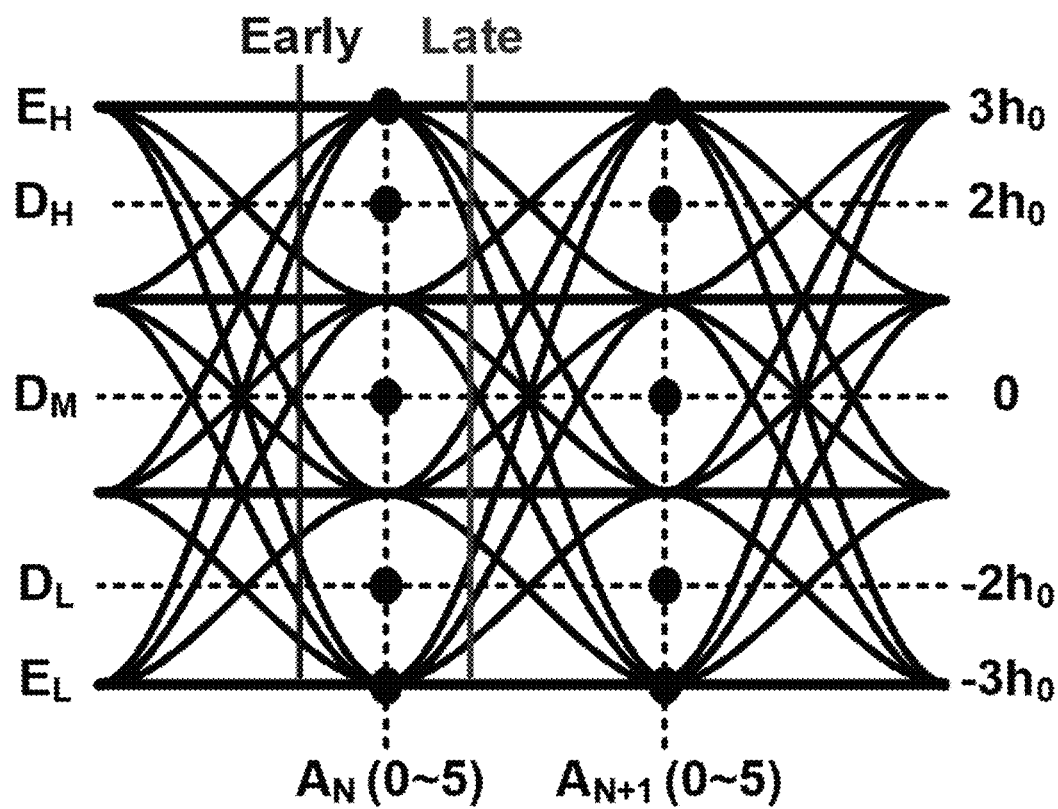
FIGS. 5 to 8 are views illustrating a statistical learning process for optimizing PAM-4 CDR according to an embodiment of the present disclosure.

Sampling offsets and timings of the 10 samplers are shown in FIG. 5. 10 points expressed within the PAM-4 waveform are sampling points of the 10 samplers. A result of sampling two consecutive PAM-4 data symbols by 10 samplers is expressed by an ordered pair of $B_N=(A_N, A_{N+1})$ on the assumption that a result of sampling one PAM-4 data symbol is $A_N$. Since $A_N$ has six cases in total from 0 to 5 according to the output of the sampler, $B_N$ may have the number of cases of 6*6=36.

Figure 6:
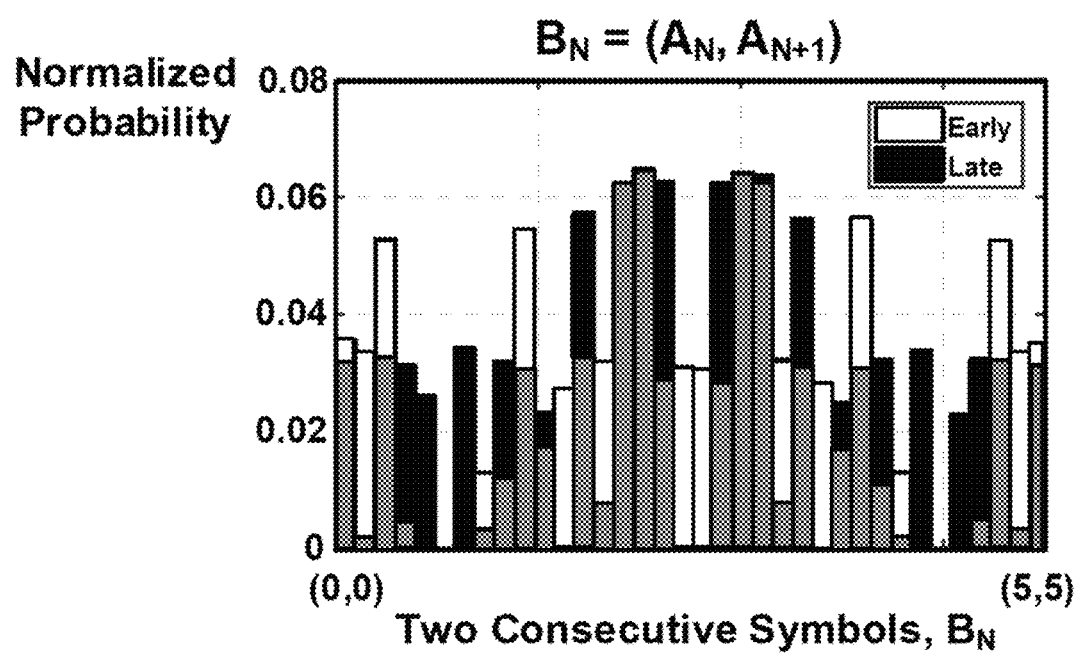

A histogram may be obtained by continuously sampling random input data and accumulating the numbers of occurrences for 36 cases for a long time. In particular, FIG. 6 shows a result of obtaining a histogram for a case where the sampling clock has an earlier phase than data (Early) as indicated by the line having a label "Early" in FIG. 5, and a case where the sampling clock has a later phase than data (Late) as indicated by the line having a label "Late" in FIG. 5.

Figure 7:
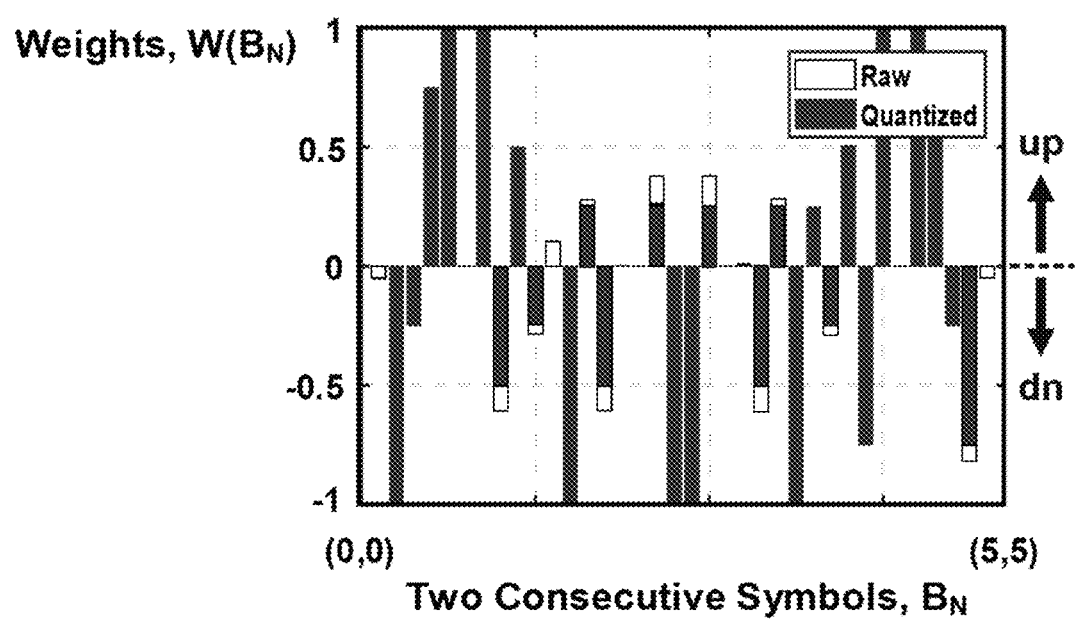

To the contrary, when the result of sampling input data corresponds to any number from 0 to 35, it may be calculated whether it is Early or Late by inverse estimation with conditional probability. When statistical calculation is performed by using the Bayesian theorem, a weight function corresponding to whether the clock sampling timing should be further brought forward or should be put off in each case may be statistically calculated. When an event corresponding to a certain number from 0 to 35 occurs, the weight function may be calculated by subtracting the Early conditional probability from the Late conditional probability. The weight function obtained in this process is shown in FIG. 7, and may be expressed by the following Equation:

$$Pr(\text{Early} | N) = \frac{Pr(N | \text{Early})Pr(\text{Early})}{Pr(N)}$$

$$Pr(\text{Late} | N) = \frac{Pr(N | \text{Late})Pr(\text{Late})}{Pr(N)}$$

Weight Function of $N = Pr(\text{Late} | N) - Pr(\text{Early} | N)$

Figure 8:
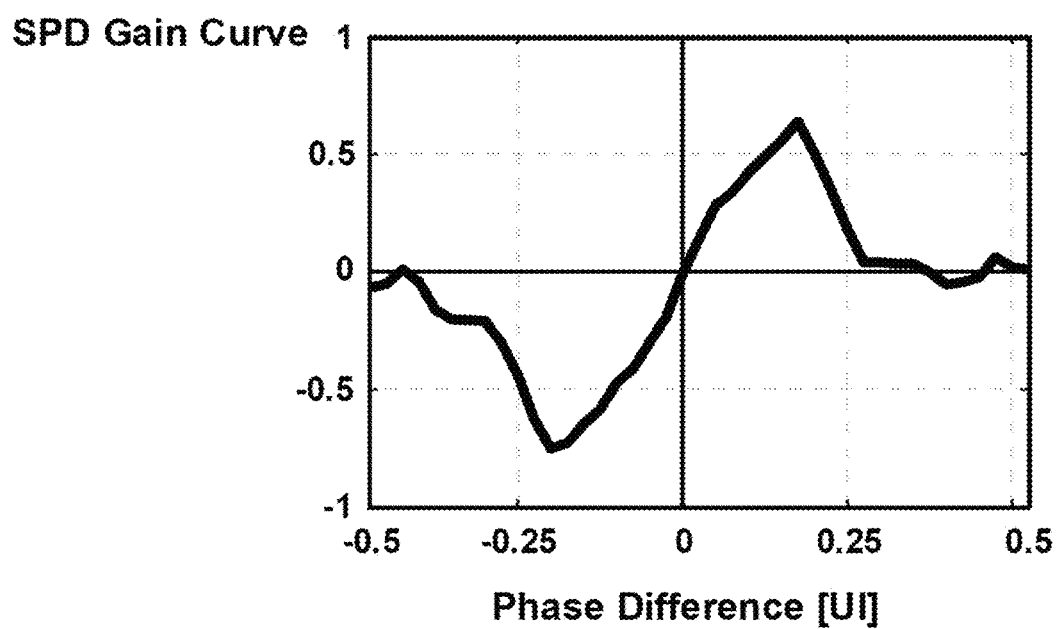
Figure 9:
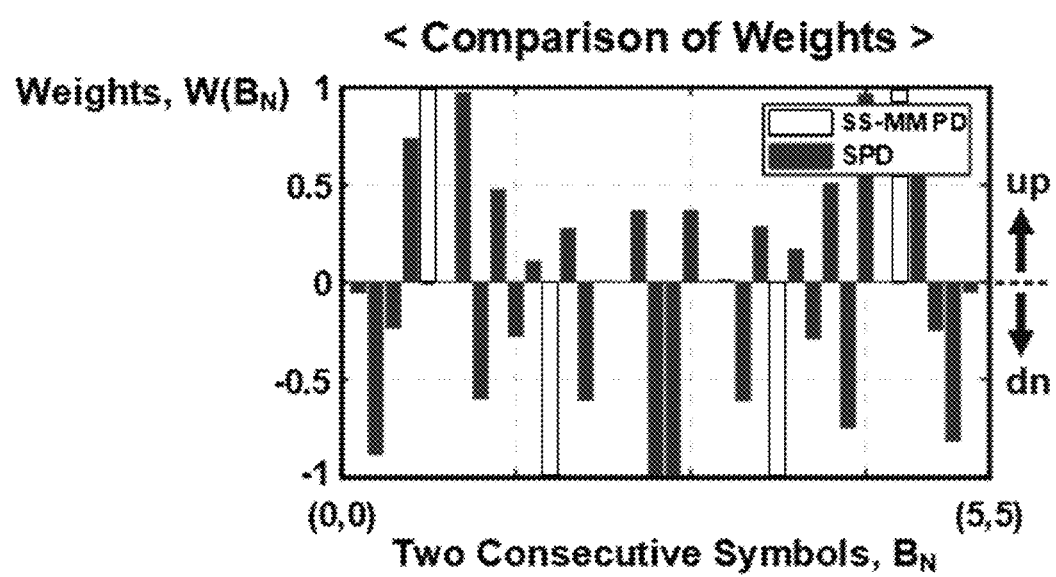
FIGS. 9 and 10 are views illustrating comparison of weight functions of an SPD for PAM-4 proposed in an embodiment of the present disclosure, and an SS-MMPD.
Figure 10:
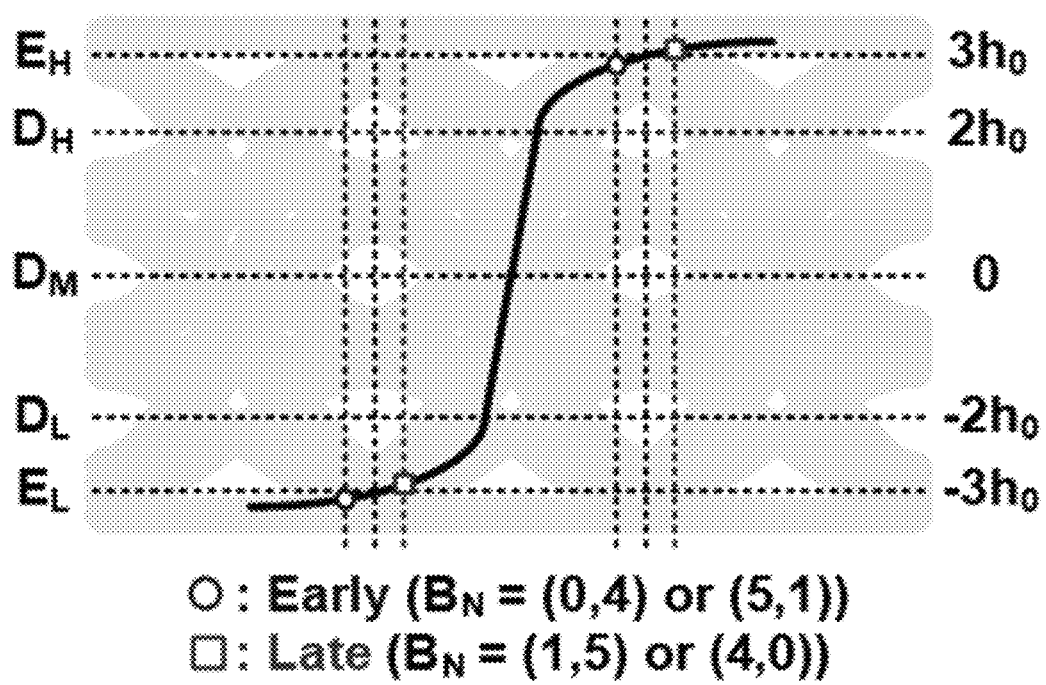

Theoretically, the weight function may have a value between −1 and 1. When this value is quantized into a desired bit number, a multiplier of digital hardware may be implemented afterward. Accordingly, when a digital loop filter is configured by sampling input data according to the table of calculated weight functions, multiplying the weight functions according to circumstances, and accumulating the weight functions, a controller logic for the clock and data recovery circuit may be completed. Since the controller logic is configured only by using multiplication for the input, the controller logic can be simplified in a hardware level and power consumption can be reduced. Finally, a gain curve of a phase detector (PD) which records output of the digital loop filter according to an input phase by using the clock and data recovery circuit is obtained as shown in FIG. 8.

Accordingly, the clock and data recovery circuit for the PAM-4 receiver and the optimization technique by statistical learning according to an embodiment of the present disclosure may have a great advantage in implementing a high-speed and low-power PAM-4 receiver IC, and the technique of optimizing by using statistical learning may be applied to optimization of other integrated circuit systems.

The easiest way to identify whether the clock and data recovery circuit according to an embodiment of the present disclosure operates well even at high speed, compared to a PAM-4 clock and data recovery circuit utilizing existing MMCDR or SS-MMCDR is by identifying whether a clock finally recovered in aspect of a single bit response (SBR) samples data at the highest point of the SBR.

Assuming that an existing sign-sign Mueller-Muller phase detector (SS-MMPD) is implemented for PAM-4 by using three data samplers $D_H$, $D_M$, $D_L$ and two error samplers $E_H$, $E_L$ for comparison under the same condition, the phase error is detected only for 4 cases of BN. For two cases of (0,4) and (5,1), Early is determined, and for two cases of (1, 5) and (4, 0), Late is determined. If this is displayed in the same weight space as the stochastic phase detector (SPD) for PAM-4 proposed in the embodiment of the present disclosure, it can be seen that all cases where the weight functions of the SS-MMPD are present are included in the weight functions of the SPD proposed in the embodiment of the present disclosure. Accordingly, since the SPD detects a phase difference even in the cases where an existing SS-MMPD does not detect, it can be seen that operations may be performed with higher reliability.

Figure 11:
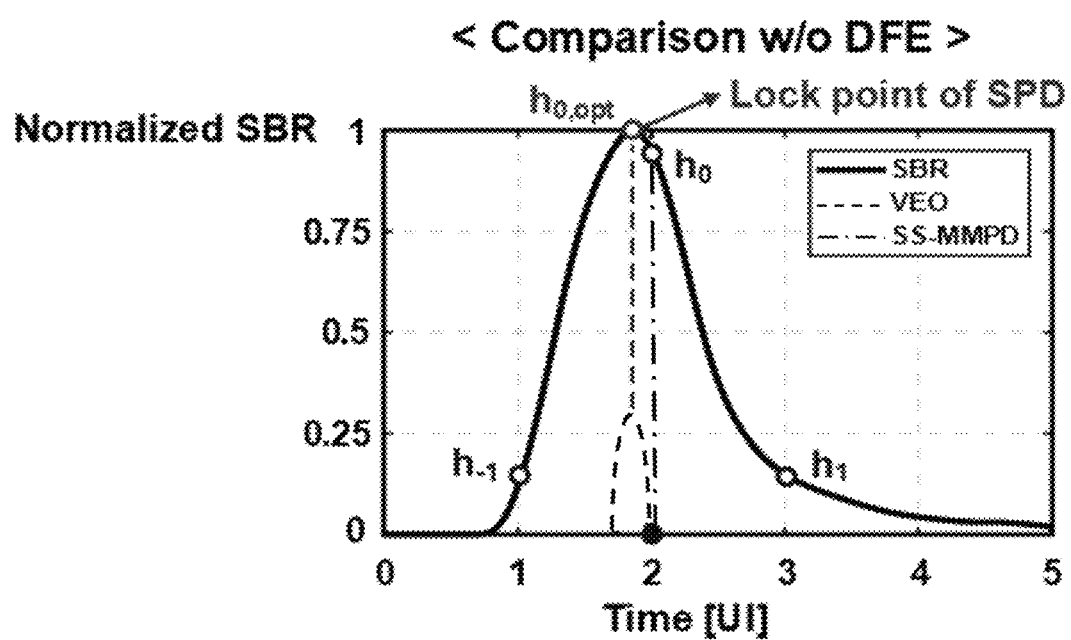
FIGS. 11 and 12 are views illustrating comparison of lock behaviors according to the presence/absence of a DFE of the SPD for PAM-4 proposed in an embodiment of the present disclosure, and the SS-MMPD.
Figure 12:
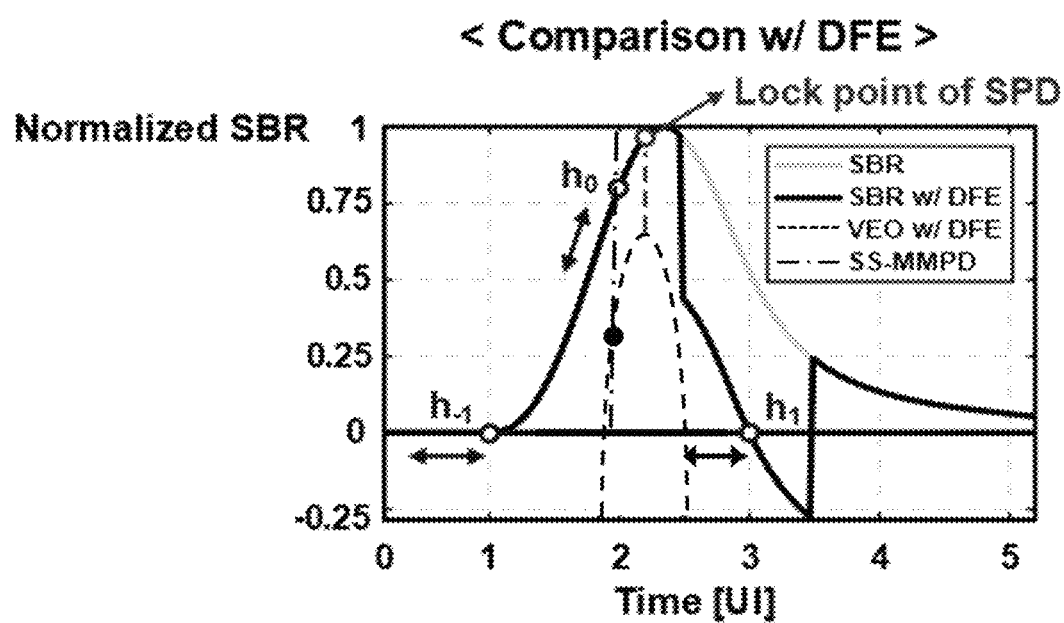

FIGS. 11 and 12 illustrate graphs showing the SBR and the PAM-4 vertical eye opening (VEO) regarding two PDs. If the DFE is not used, the SS-MMPD locks the first post-cursor $h_1$ and the first pre-cursor $h_{-1}$ at the same point on the SBR, and thus locks at the point with a black-filled circle where the VEO is insufficient. In addition, even when one-tap adaptive DFE is used, the SS-MMPD locks wherever $h_{-1}$ is zero and drifts eventually. Consequently, it suffers from a multiple-locking problem. On the other hand, the SPD for PAM-4 proposed for two cases exactly locks at the point where the VEO is maximized, and accordingly, it can be seen that more optimized PD performance is shown.

Figure 13:
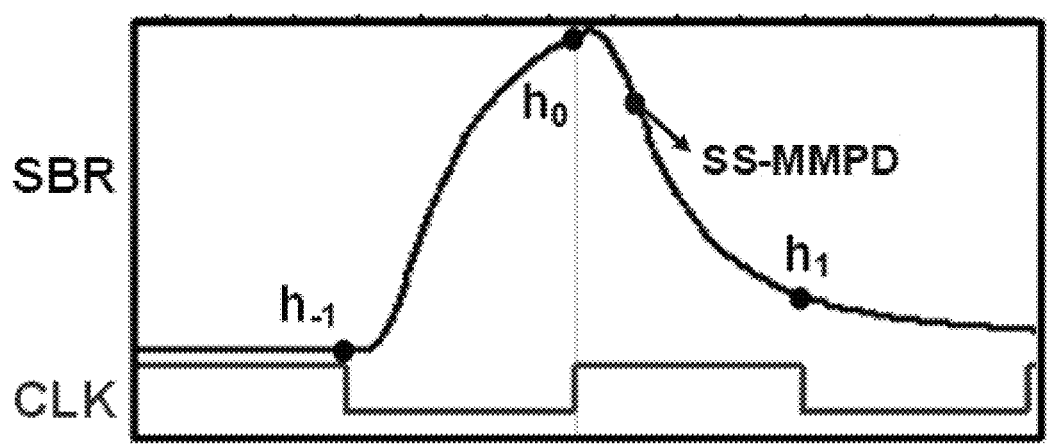
FIG. 13 is a view illustrating a simulation waveform of a CDR circuit according to an embodiment of the present disclosure.

FIG. 13 illustrates a simulation waveform of the clock and data recovery circuit according to an embodiment of the present disclosure. For a 56 Gbps RAM-4 receiving operation, channel attenuation corresponding to 7 dB is given at the Nyquist frequency of 14 GHz, and as a result of a real simulation, it is identified that the SPD for PAM-4 proposed in the embodiment of the present disclosure locks at the maximum point of the SBR.

Figure 14:
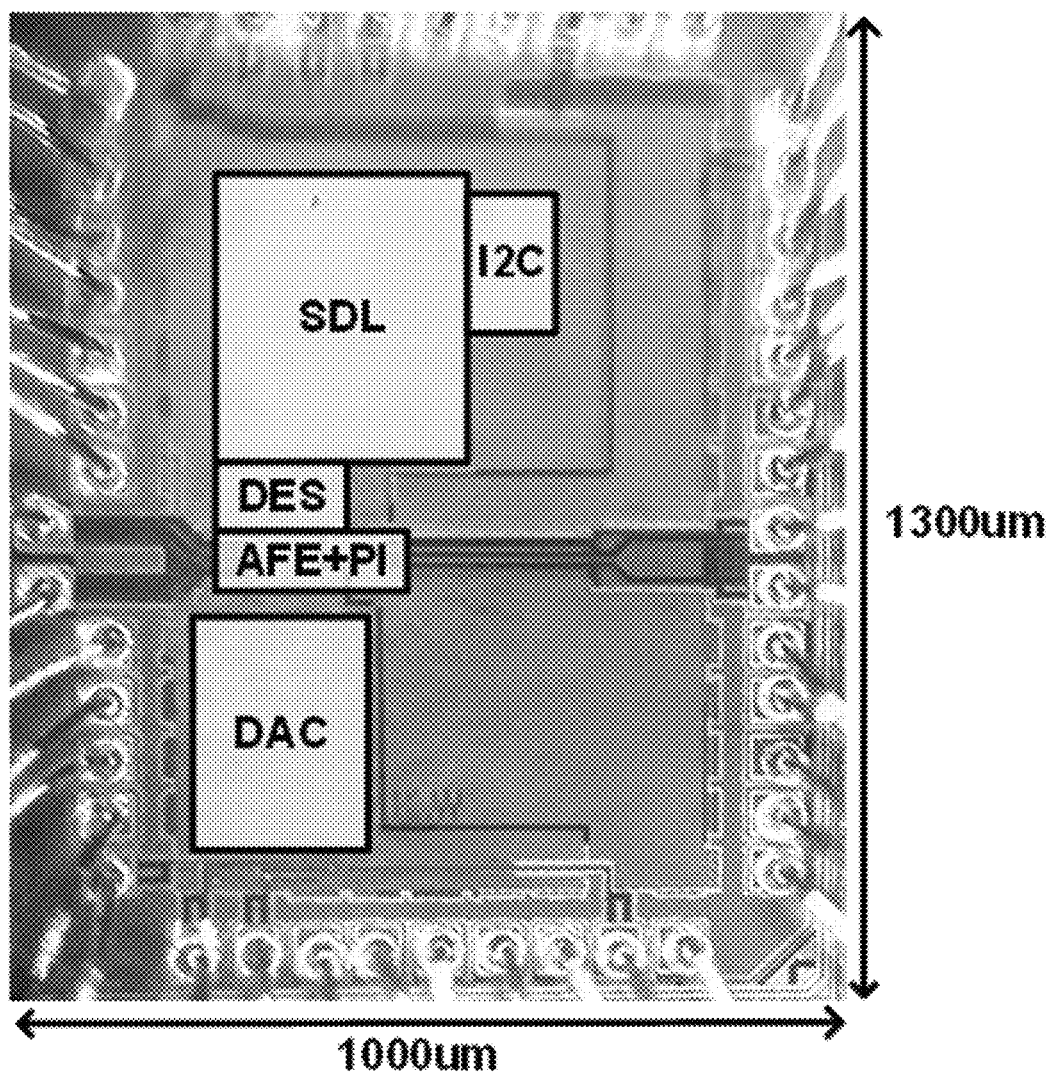
FIG. 14 is a view illustrating a photo of a 48 Gb/s PAM-4 receiver chip fabricated in a real 40 nm CMOS process.
Figure 15:
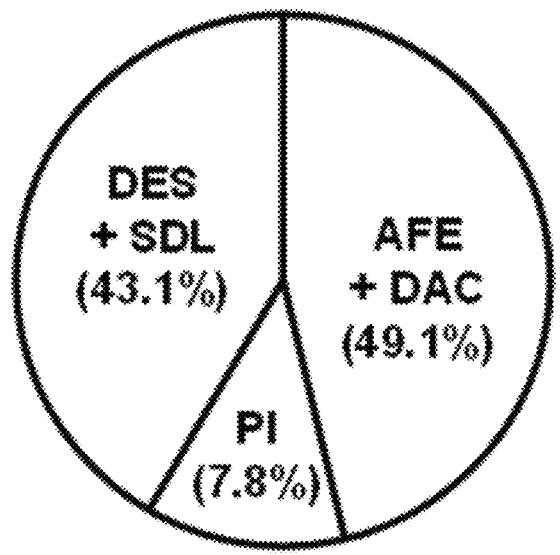
FIG. 15 is a view illustrating power used for each block of the fabricated 48 Gb/s PAM-4 receiver chip.

A chip photo of a 47 Gb/s PAM-4 receiver chip fabricated through a 40 nm CMOS semiconductor process to be verified is shown in FIG. 14, and Power Breakdown displaying power used for each block is shown in FIG. 15.

Figure 16:
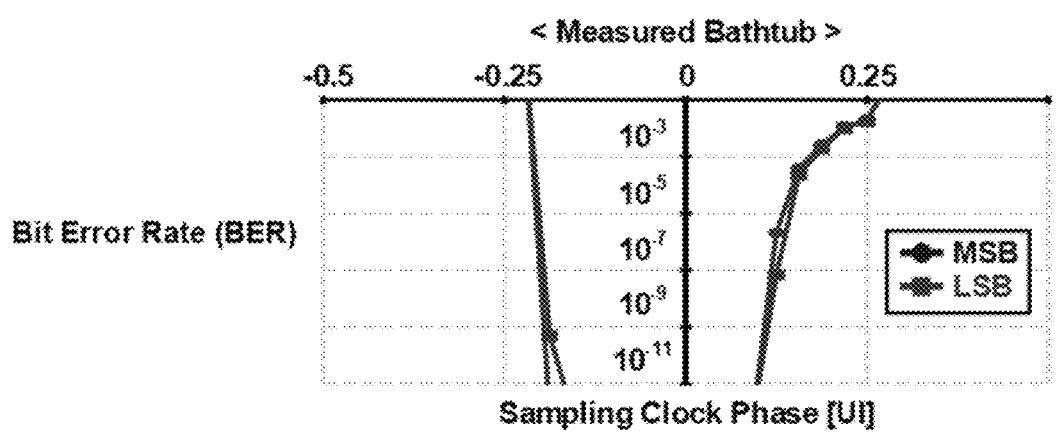
FIGS. 16 to 18 are views illustrating a bathtub, a jitter tolerance, an internal eye diagram measured at the fabricated PAM-4 receiver.
Figure 17:
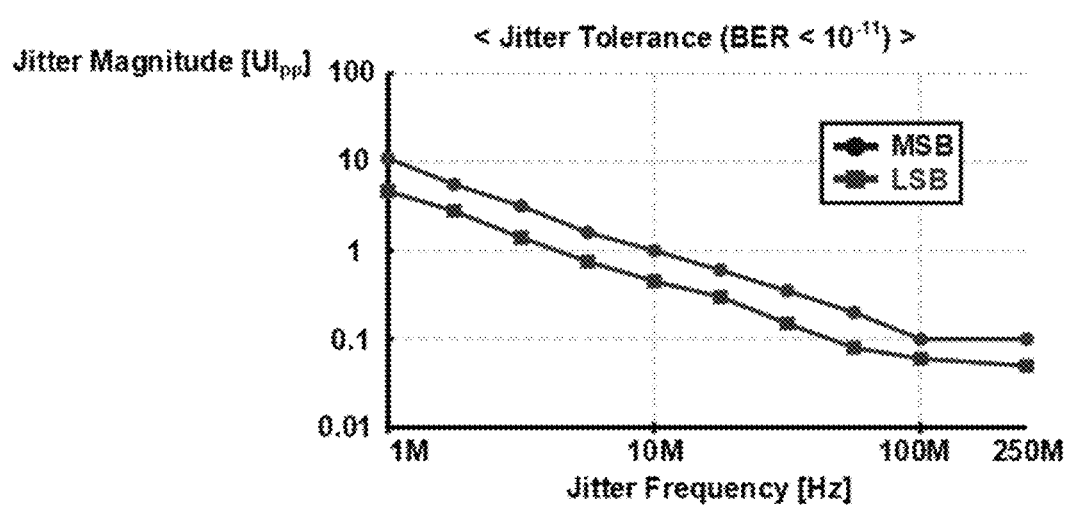
Figure 18:
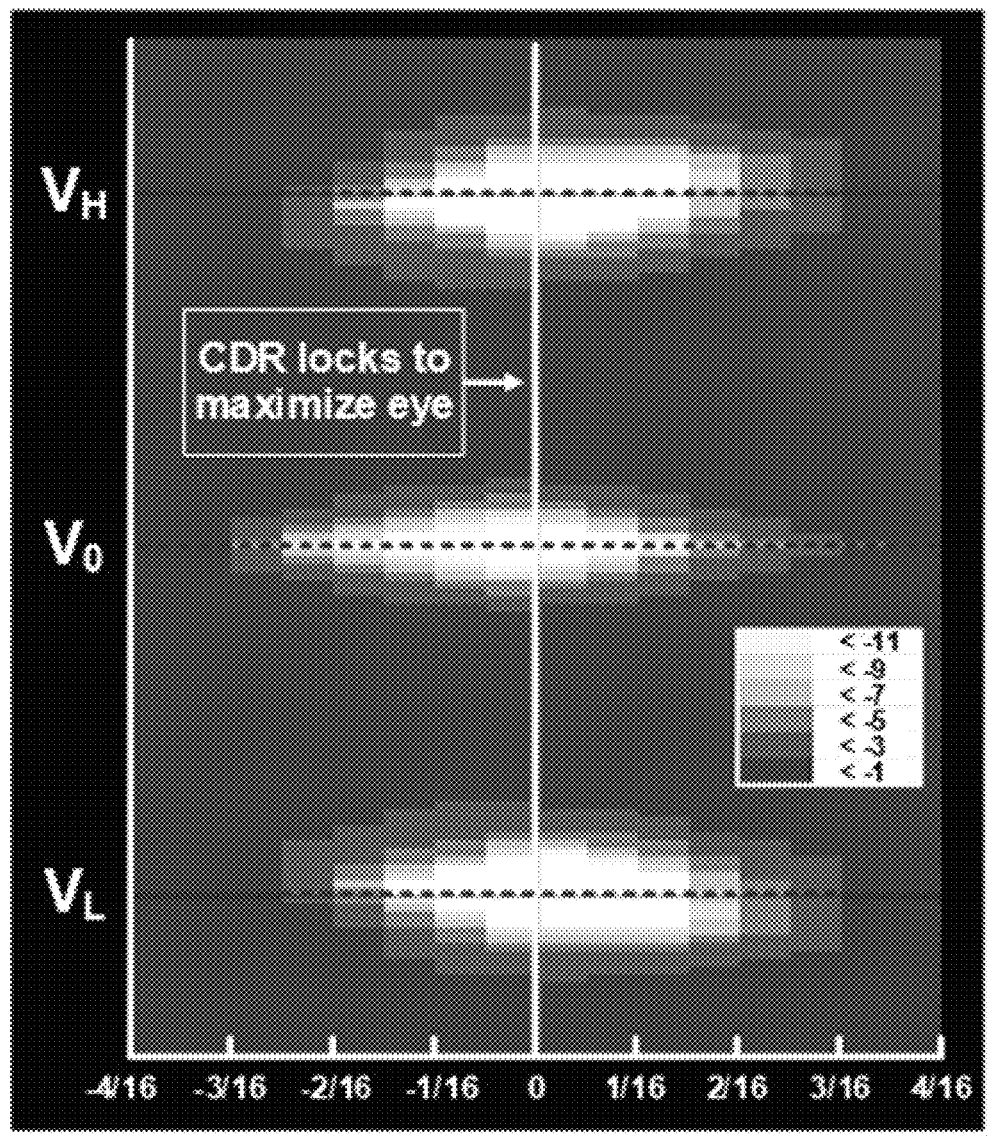

A result of measuring at the receiver chip is proposed in FIGS. 16 to 18. The drawings show a bathtub and a jitter tolerance curve, and an internal eye diagram was measured to show whether the CDR locks at the optimization point of real PAM-4 DATA.

FIG. 19 illustrates comparison of performance of the PAM-4 receiver chip according to an embodiment of the present disclosure, and other PAM-4 receiver chips.

Up to now, the clock and data recovery circuit for the high-speed PAM-4 receiver using statistical learning has been described in detail with reference to preferred embodiments.

In the above-described embodiments, to solve the problems of the oversampling-based clock and data recovery circuit used for an existing PAM-4 receiver, or the Baud-rate sampling-based clock and data recovery circuit, which is representative of the Mueller-Muller clock and data recovery circuit, a clock and data recovery circuit of a new structure for a PAM-4 receiver is proposed and a method for optimizing in a simple structure through statistical learning is proposed.

In embodiments of the present disclosure, by utilizing the advantages of the Baud-rate sampling-based clock and data recovery circuit, a hardware structure can be simplified and energy efficiency can be enhanced, compared to the existing oversampling-based clock and data recovery circuit for the PAM-4 receiver.

In addition, unlike the existing Baud-rate sampling-based clock and data recovery circuit for the PAM-4 receiver which has problems under a high-speed wired communication environment where signal attenuation is strong, the clock and data recovery circuit can operate well even when signal attenuation is great.

The clock and data recovery circuit according to an embodiment of the present disclosure can be optimized in a relatively simple method by using a statistical learning technique using big data, and the optimization method can be applied to optimize other IC systems including a receiver and/or a data processor in addition to the clock and data recovery circuit.

The technical concept of the present disclosure may be applied to a computer-readable recording medium which records a computer program for performing the functions of the apparatus and the method according to the present embodiments. In addition, the technical idea according to various embodiments of the present disclosure may be implemented in the form of a computer readable code recorded on the computer-readable recording medium. The computer-readable recording medium may be any data storage device that can be read by a computer and can store data. For example, the computer-readable recording medium may be a read only memory (ROM), a random access memory (RAM), a CD-ROM, a magnetic tape, a floppy disk, an optical disk, a hard disk drive, or the like. A computer readable code or program that is stored in the computer readable recording medium may be transmitted via a network connected between computers.

In addition, while preferred embodiments of the present disclosure have been illustrated and described, the present disclosure is not limited to the above-described specific embodiments. Various changes can be made by a person skilled in the art without departing from the scope of the present disclosure claimed in claims, and also, changed embodiments should not be understood as being separate from the technical idea or prospect of the present disclosure.

What is claimed is:

1. A clock and data recovery device comprising:
circuitry comprising:
an input unit through which data is inputted;
a clock input unit through which a clock is inputted;
a sampling processor configured to sample the inputted data by using the inputted clock;
a controller configured to combine results of sampling at a plurality of sampling points, to determine a state of the clock based on the combined results, and to generate a control value for controlling the clock; and
an adjustment processor configured to adjust the clock used by the sampling processor, based on the control value generated by the controller.

2. The clock and data recovery device of claim 1, wherein the results of sampling at the plurality of sampling points include a first sampling result at a first sampling point and a second sampling result at a second sampling point, and
wherein, for the combining the results of sampling at the plurality of sampling points, the controller is further configured to combine the first sampling result at the first sampling point and the second sampling result at the second sampling point.

3. The clock and data recovery device of claim 2, wherein the first sampling point and the second sampling point are consecutive sampling points which are adjacent to each other.

4. The clock and data recovery device of claim 1, wherein a number of the combined results of sampling at the plurality of sampling points is (Number of sampling results)^(Number of sampling points).

5. The clock and data recovery device of claim 1, wherein the controller is configured to generate the control value, using the combined results, to be used for shifting the clock forward or backward.

6. The clock and data recovery device of claim 5, wherein the controller is configured to generate the control value for shifting the clock forward or backward, based on a first probability which is a probability that a sampling point matching a combined result is ahead of a preset reference point, and a second probability which is a probability that the sampling point is behind the preset reference point.

7. The clock and data recovery device of claim 6, wherein the controller is configured to generate the control value whereby an amount for shifting the clock backward is larger if the first probability is higher than the second probability.

8. The clock and data recovery device of claim 6, wherein the controller is configured to generate the control value whereby an amount for shifting the clock forward is larger if the second probability is higher than the first probability.

9. The clock and data recovery device of claim 6, wherein the first probability and the second probability matching the combined results are set by statistical values of measurements by using a plurality of data and a plurality of clocks.

10. The clock and data recovery device of claim 1, wherein the adjustment processor is configured to adjust a phase of the clock used by the sampling processor, based on the control value.

11. A clock and data recovery method comprising:
inputting data;
inputting a clock;
sampling, by a sampling processor, the inputted data by using the inputted clock;
combining results of sampling at a plurality of sampling points;

determining a state of the clock based on the combined results, and generating a control value for controlling the inputted clock; and adjusting the inputted clock used by the sampling processor, based on the generated control value, wherein the adjusting further includes adjusting a phase of the inputted clock used by the sampling processor, based on the control value.

12. The method of claim 11, wherein the combining the results of sampling at the plurality of sampling points further includes combining a first sampling result at a first sampling point and a second sampling result at a second sampling point.

13. The method of claim 11, wherein the generating the control value further includes generating the control value using the combined results.

14. The method of claim 13, wherein the generating the control value further includes generating the control value to be used for shifting the clock forward or backward.

15. The method of claim 14, wherein the generating the control value further includes generating the control value for shifting the clock forward or backward, based on a first probability which is a probability that a sampling point matching a combined result is ahead of a preset reference point, and a second probability which is a probability that the sampling point is behind the preset reference point.

16. The method of claim 15, wherein an amount for shifting the clock backward is larger if the first probability is higher than the second probability.

17. The method of claim 15, wherein an amount for shifting the clock forward is larger if the second probability is higher than the first probability.

18. The method of claim 15, wherein the first probability and the second probability matching the combined results are set by statistical values of measurements by using a plurality of data and a plurality of clocks.

19. A clock and data recovery device comprising:
circuitry comprising:
   a sampling processor configured to sample data by using a clock;
   a controller configured to combine results of sampling at a plurality of sampling points, to determine a state of the clock based on the combined results, and to generate a control value for controlling the clock; and
an adjustment processor configured to adjust the clock applied to the sampling processor, based on the control value generated by the controller.

* * * * *